United States Patent
Chaudhary et al.

(10) Patent No.: US 7,072,815 B1
(45) Date of Patent: Jul. 4, 2006

(54) RELOCATION OF COMPONENTS FOR POST-PLACEMENT OPTIMIZATION

(75) Inventors: Kamal Chaudhary, San Jose, CA (US); Krishnan Anandh, San Jose, CA (US); Sudip K. Nag, San Jose, CA (US); Guenter Stenz, Campbell, CA (US)

(73) Assignee: Xilinx, Inc., San Jose, CA (US)

( * ) Notice: Subject to any disclaimer, the term of this patent is extended or adjusted under 35 U.S.C. 154(b) by 843 days.

(21) Appl. No.: 10/213,775

(22) Filed: Aug. 6, 2002

(51) Int. Cl.
*G06F 9/455* (2006.01)

(52) U.S. Cl. ............... 703/13; 703/1; 716/8; 716/9; 716/7; 716/18; 716/13; 716/6

(58) Field of Classification Search ............... 703/1, 703/13; 716/6, 7, 8, 13, 18, 9; 385/15
See application file for complete search history.

(56) References Cited

U.S. PATENT DOCUMENTS

| | | | |
|---|---|---|---|
| 5,798,936 A * | 8/1998 | Cheng | 716/13 |
| 6,415,426 B1 * | 7/2002 | Chang et al. | 716/9 |
| 2001/0047507 A1 * | 11/2001 | Pileggi et al. | 716/8 |
| 2002/0176648 A1 * | 11/2002 | Bhat et al. | 385/15 |
| 2003/0005398 A1 * | 1/2003 | Cho et al. | 716/8 |
| 2003/0084416 A1 * | 5/2003 | Dai et al. | 716/7 |
| 2003/0233628 A1 * | 12/2003 | Rana et al. | 716/18 |
| 2004/0205683 A1 * | 10/2004 | Kovacs-Birkas et al. | 716/6 |

OTHER PUBLICATIONS

Lin et al., "Performance driven constructive placement", IEEE 1990.*
Arnold, M et al., "An iterative maze router with hints", IEEE 1988.*
Igusa et al., "ORCA A sea-of-gates place and route system", ACM 1989.*

* cited by examiner

*Primary Examiner*—Leo Picard
*Assistant Examiner*—Kandasamy Thangavelu
(74) *Attorney, Agent, or Firm*—W. Eric Webostad (57) ABSTRACT

Method and apparatus for post-placement optimization of resources for connections is described. To optimize resource placement, search windows are generated responsive to driver and load components, as well as to a connection between the driver and load components. Adding in a straight-line path search window may be used as an alternative where a bypassed resource is to be relocated. Using connection-based optimization in combination with driver- and resource-based optimization results in improved optimization with negligible impact on runtime.

24 Claims, 10 Drawing Sheets

RELOCATION OF COMPONENTS FOR POST-PLACEMENT OPTIMIZATION

FIELD OF THE INVENTION

The present invention relates generally to placement of components, and more particularly to placement optimization of integrated circuit components.

BACKGROUND OF THE INVENTION

Integrated circuits are formed of many circuit elements, commonly referred to for placement as resources, cells, components, logic blocks and the like. In other words, components for an integrated design are placed relative to one another in what is known as a placement process. Data input to a conventional placer tool includes associations between components, such as connectivity data. A signal path may comprise multiple connections as three or more components or resources may be used to create a signal path. Multiple signal paths form a network of components, and that signal paths have associated target delays. After placement and routing of components, a conventional placement optimizer was used to improve placement to facilitate operating an integrating circuit at an increasingly higher clock frequency.

Conventional placement optimizers or optimizations are component or logic block based. Such conventional optimizers pick up components from an existing placement and attempt to find a better location or site to place such components of an integrated circuit. If a component site under consideration is empty, a proposed or tentative component placement may be used to evaluate for improvement in path or connection. If, however, a proposed site is presently occupied by another component, component locations are temporarily swapped to evaluate whether a connection or path delay improves. Evaluation of whether or not improvement results from moving a component to an open site or swapping components is done with a placement cost function. A placement cost function responsive to a tentative relocation of the component or swap of components is evaluated to estimate effect of such a proposed repositioning in order to select a best resulting cost, such as a lower delay time, a smaller die size, fewer connections, and the like.

Due to the number of components forming an integrated circuit, especially a complex integrated circuit, it is impractical for purposes of runtime reasons to attempt to evaluate repositioning of all possible component relocations. As not all possible relocations are attempted, optimizer quality depends on which components are tried and how tried sites for such components to be placed or relocated are selected. Conventional optimizers select sites within a small window centered about a current component position under consideration for repositioning. By limiting relocation of a component to within a window centered about such a component, runtime is reduced for purposes of optimization. However, a limited window also limits distance by which a component may be repositioned, and thus limits the degree of improvement one may obtain by optimization should a better solution be found outside such a window.

Accordingly, it would be both desirable and useful to provide optimization means that allows more room for improvement than that previously afforded by prior optimizers but which has negligible impact on runtime as compared with runtime of such prior optimization means.

SUMMARY OF THE INVENTION

An aspect of the invention is a post-placement optimization process. Provided is a simulation of an integrated circuit having simulated connections with associated delays. Collected are critical connections from the simulated connections having associated negative slack times, and the critical connections collected are ranked responsive to the negative slack times. A critical connection is selected from the ranking having a driver component and a load component. Component windows for the critical connection selected and a connection window for the critical connection selected are generated. Determined are overlaps between the connection window and each of the component windows to provide a first and a second search window. A first site is selected in the first search window for the driver component, and a second site is selected in the second search window for the load component. Costs of the first site and the second site are compared to select a cost.

An aspect of the present invention is a method for simulating relocation a component of an integrated circuit having a plurality of components coupled to one another by interconnects, where the interconnects have associated delays. Identified is at least one connection having a driver and a load component. A first component sample window is generated in response to the driver component. A second component sample window is generated in response to the load component. A connection window is generated in response to the at least one connection. A driver window is generated in response to overlap between the connection window and the first component window. A load window is generated in response to overlap between the connection window and the second component window. A site for relocating the component is determined, and the component is relocated to the location.

An aspect of the present invention is a method for simulating relocation of a component of an integrated circuit having a plurality of components coupled to one another by interconnects, where the interconnects have associated delays. A bypass component is identified. A driver component and a load component of the bypass component are selected. A first component sample window and a second component sample window are generated in response to the driver and load components, respectively. A connection window is generated in response to the at least one connection. A path window is generated responsive to the driver component and the load component. A driver window is generated in response to overlap between the connection window and the first component window. A load window is generated in response to overlap between the connection window and the second component window. Determined is a site for relocating the component, and the component is relocated to the location.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the present invention may admit to other equally effective embodiments.

DETAILED DESCRIPTION OF THE DRAWINGS

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 1:
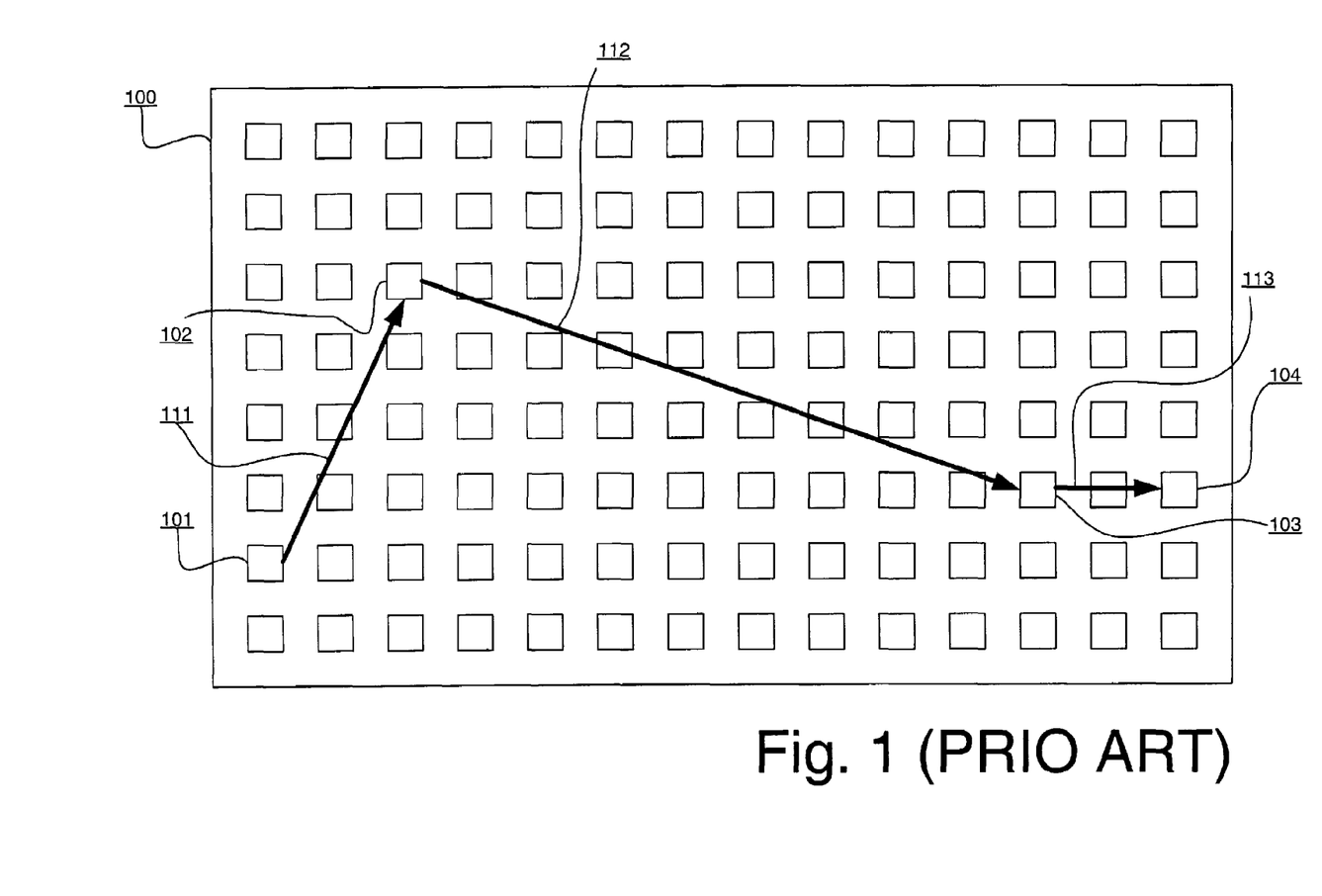
FIG. 1 is a top view block diagram of an exemplary embodiment of an integrated circuit having a path and a plurality of components of the prior art.

FIG. 1 is a top view block diagram of an exemplary embodiment of an integrated circuit 100. Integrated circuit 100 comprises a plurality of components of which components 100, 101, 102, 103 and 104 are used to provide a signal path. Components 101 and 102 are coupled to one another via connection 111. Components 102 and 103 are coupled to one another via connection 112. Components 103 and 104 are coupled to one another via connection 113. Input placement data includes which components are to be connected to one another. Conventionally, connection delay estimates associated with connections between components are provided with placement data, such as at least in part based on connection length. Though only one path is shown here for purposes of clarity, it is well known that an integrated circuit comprises a multiplicity of signal paths or networks. It will be apparent from the description that follows that the present invention may be used to optimize a multiplicity of signal paths of an integrated circuit though only a single path optimization is illustratively shown for purposes of clarity.

Figure 2A:
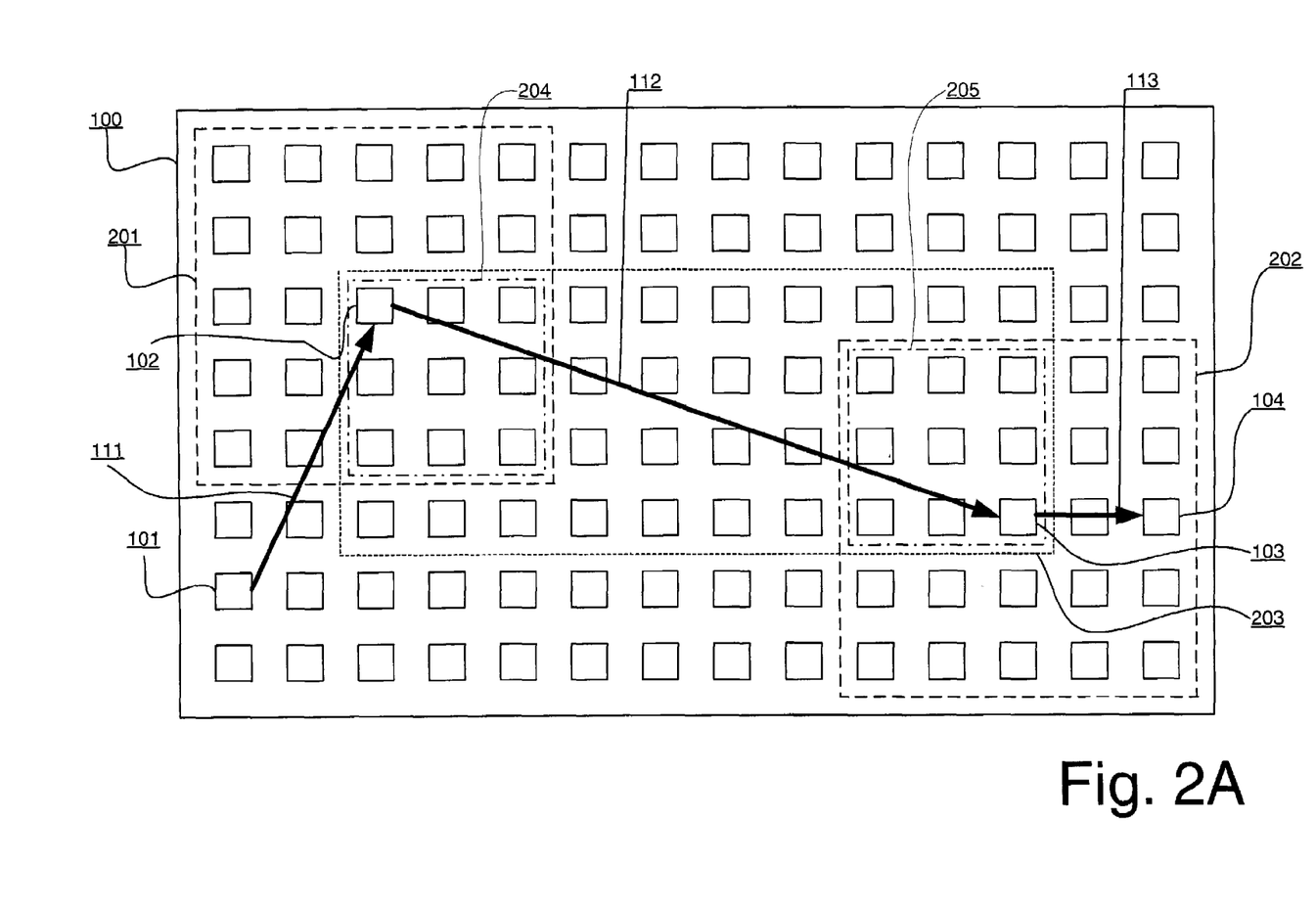
FIGS. 2A and 2B are top views of block views of diagram of the integrated circuit of FIG. 1 with exemplary embodiments of component sample windows in accordance with one or more aspects of the present invention.

Referring to FIG. 2A, there is shown integrated circuit 100 of FIG. 1 having component sample windows 201, 202, and 203 in accordance of one or more aspects of the present invention. For purposes of clarity, a source and a destination component are selected for improvement; however, it will be apparent that other components may be selected. Component sample window 201 is for a source or driver component 102. Component sample window 201 is centered about driver component 102 with a component epsilon or delta of two components. Notably, an epsilon of fewer or more than two components may be used for component sample window 201. Furthermore, it is not necessary that component sample window 201 be centered about component 102, and thus an off-centered component sample window may be used.

Component sample window 202 is similar to component sample window 201, except that component sample window 202 is for load component 103. Source or driver component 102 is connected by connection 112 to destination or load component 103, of course as indicate by input data. Direction of arrows is used to indicate signal propagation direction, namely, from an output of a component to an input of another component. Accordingly, component sample windows 201 and 202 define areas for possibly sampling components proximal to source and destination resources of connection 112.

Component sample window 203 defines a third area. This third area is defined at least in part by connection 112, or more particularly location of source component 102 and destination component 103, and thus includes at least a portion of areas defined for possibly sampling components proximal to resources used for connection 112. In other words, components sample window 203 is defined at least in part by a connection between two resources. Because windows 201 and 202 are generated at least in partial response to location of resources 102 and 103, connection window 203, also defined at least in part by resources 102 and 103, will have overlapping areas. These overlapping areas are illustratively shown as driver window 204 and load window 205.

Areas of driver window 204 and load window 205 are respectively less than areas of component sample window 201 and 202. However, in FIG. 2B there is shown a top view block diagram of the integrated circuit 100 of FIG. 1 with a connection window 213 having a one-component epsilon in accordance with one or more aspects of the present invention. Thus, areas of driver window 204 and load window 205 may be expanded, as illustratively shown in FIG. 2B, by increasing component epsilon as compared to that shown in FIG. 2A. In other words, connection window 213 is formed having at least one component separation from resource components 102 and 103. Accordingly, driver window 214 and load window 215 have larger intersecting areas with components sample windows 201 and 202 as compared with driver window 204 and load window 205 of FIG. 2A. Notably, though a one-component epsilon separation from resource components 102 and 103 is illustratively shown, a larger epsilon separation may be used from resource components.

Figure 2B:
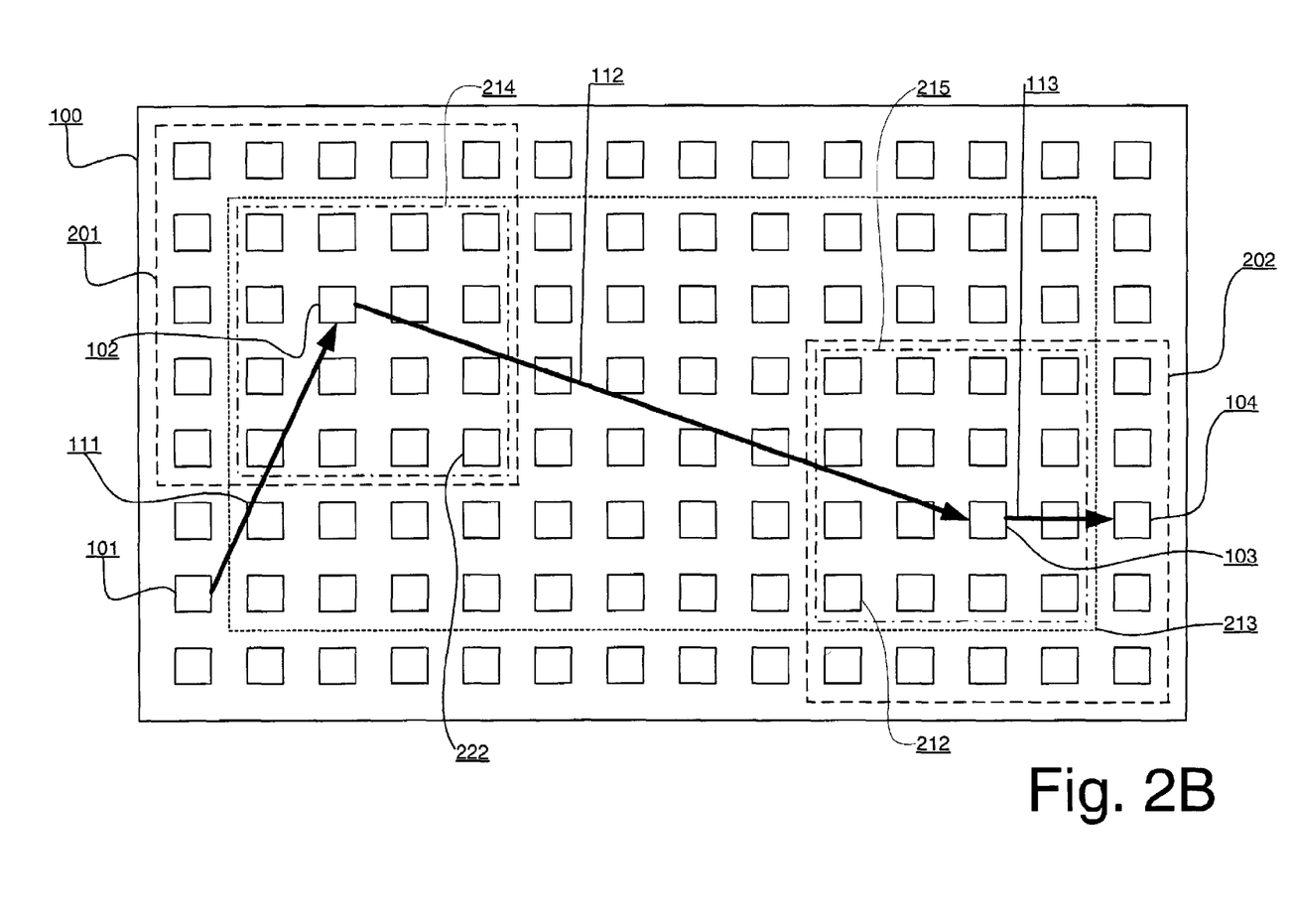

Accordingly, it should be appreciated that instead of just looking at blocks to be optimized by relocation, both position of blocks as well as their connectivity is used for evaluation. This is done by means of creating a connection window, such as connection window 203 or 213, for identifying respective resource windows, such as resource windows 204, 205 and 214, 215. By having a driver window and a load window, a driver resource may be checked for relocation within a load window, and a load resource may be checked for relocation within a driver window, as described below in more detail. Post-placement analysis may be used for optimizing one or more connections by relocation of a resource.

Figure 3:
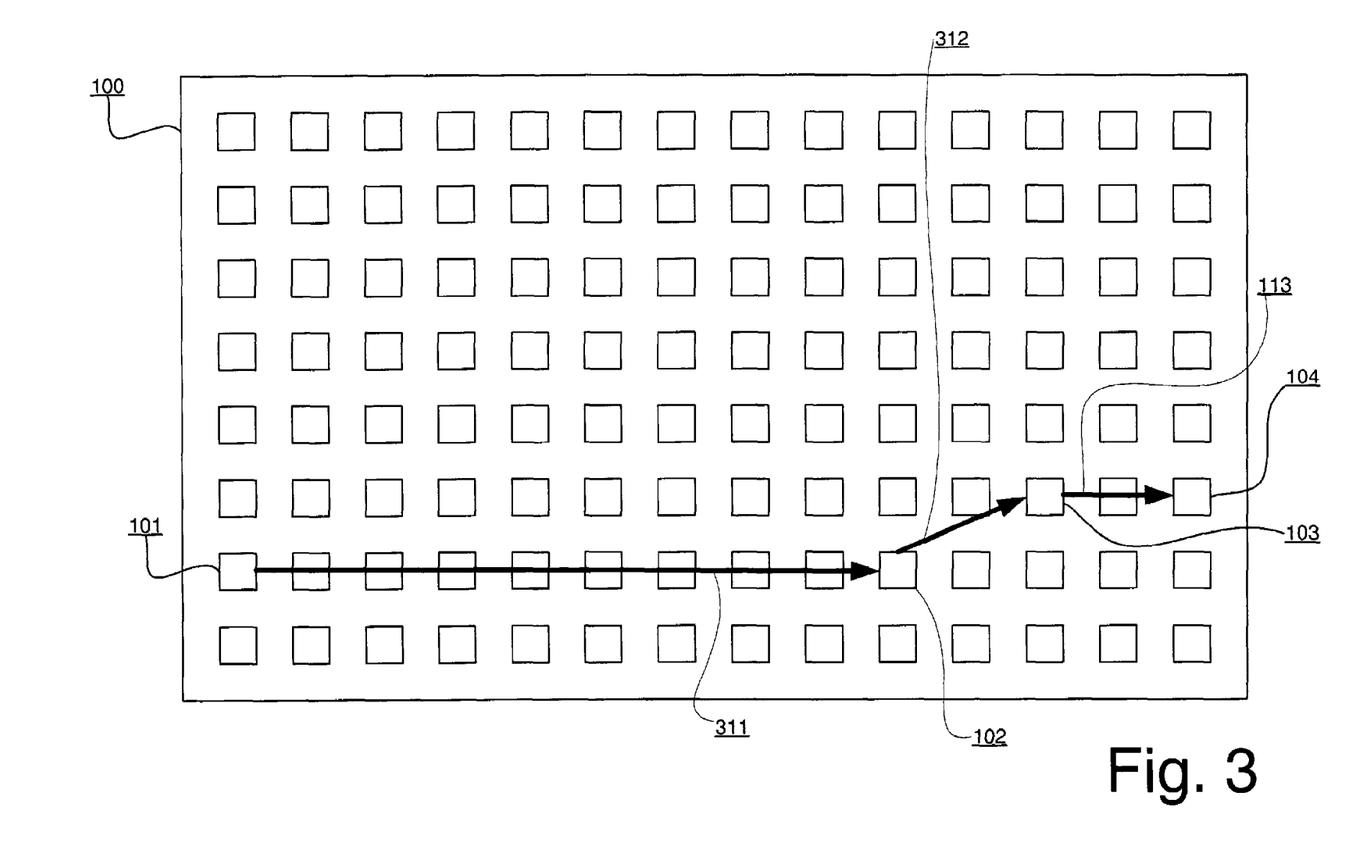
FIG. 3 is a top view block diagram of the integrated circuit of FIG. 1 after component relocation for improvement of the path of FIG. 1 in accordance with one or more aspects of the present invention.

FIG. 3 is a top view block diagram of the integrated circuit of FIG. 1 after component relocation for improvement of the path of FIG. 1 in accordance with one or more aspects of the present invention. In FIG. 3, a hypothetical new location is shown for resource 102 in load window 215 of FIG. 2 to illustratively show optimized connections 311 and 312 for coupling resources.

Figure 4:
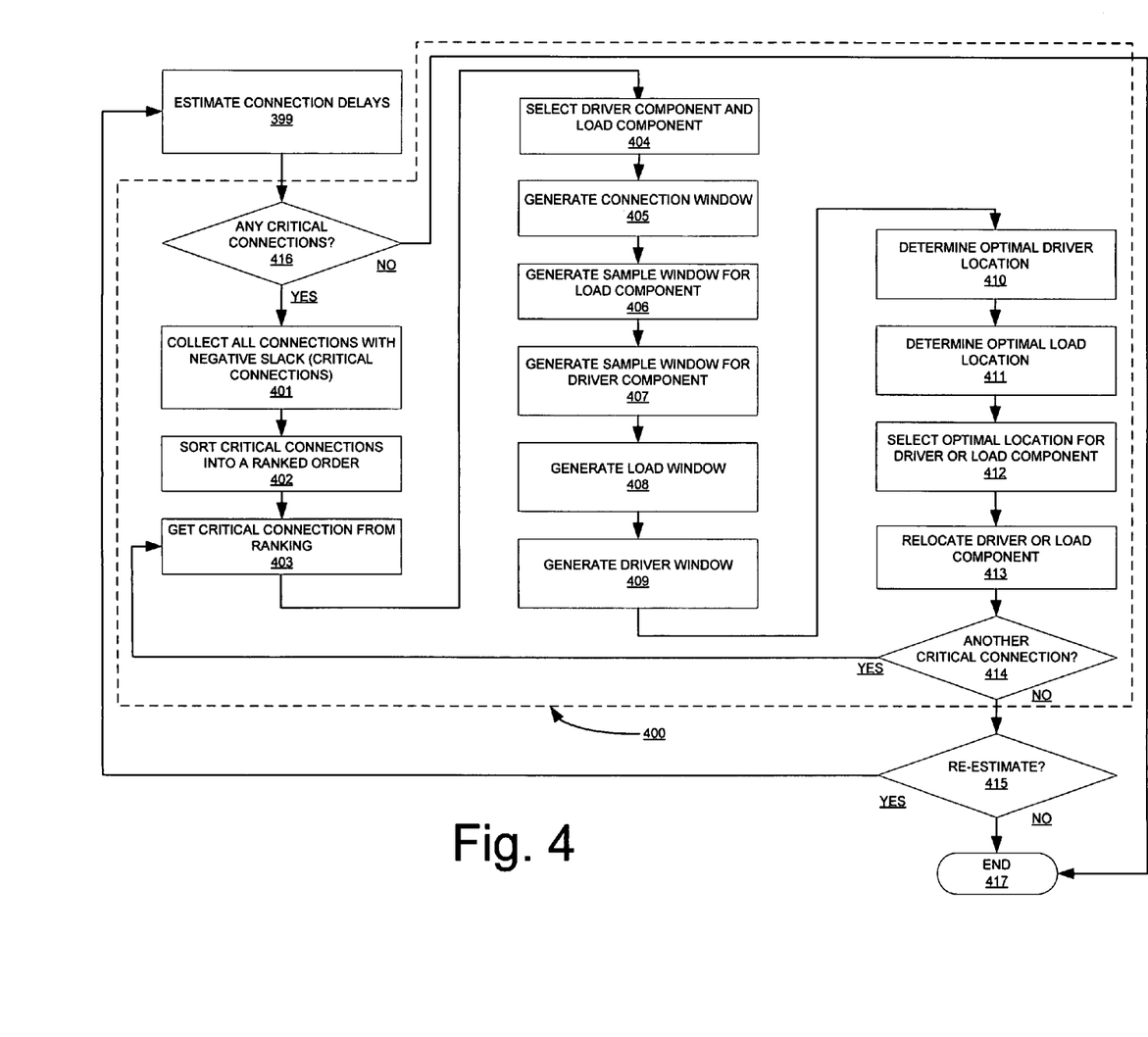
FIG. 4 is a process flow diagram of an exemplary embodiment of an optimization process in accordance with one or more aspects of the present invention.

Referring to FIG. 4, there is shown a process flow diagram of an exemplary embodiment of an optimization process 400 in accordance with one or more aspects of the present invention. As described above, an estimate of connection delays is provided for an integrated circuit as part of placement input data at step 399.

At step 416 a check is made to determine whether or not any of the connections are critical. By critical, it is meant that a connection has a negative slack time. A negative slack time indicates that a delay for a connection is in excess of a delay target. Thus, optimization process 400 may be used in order to improve connection delays. Accordingly, connections that already meet or exceed a target delay are not optimized. Alternatively, connections already meeting or exceeding a target delay may be optimized with process 400. However, for purposes of clarity, if there are no critical connections at step 416, optimization process 400 ends at step 417.

If, however, there are connections with negative slack, then at step 401, all such critical connections for an integrated circuit having a simulated placement and routing are collected. At step 402 critical connections are sorted into a ranked order. This facilitates identifying the most critical connections from the collection of the critical connections. The most critical connections will have the greatest negative slack, namely, are furthest away from a target delay.

At step 403, a critical connection is selected from the ranking of step 402. A first critical connection obtained from such a ranking may be the connection with greatest negative slack, or at least equivalent to the most critical connection, to affect the greatest benefit for runtime costs. At step 404, obtained are a driver component and a load component for such a critical connection obtained at step 403.

With continuing reference to FIG. 4 and renewed reference to FIGS. 2A and 2B, optimization process 400 is described.

At step 405, a connection window is generated responsive to the driver and load component selected at step 404. Such a connection window, such as connection window 203 or 213, may or may not have an epsilon component. At step 406, as sample window for a load component of step 404 is generated, such as component sample window 202. At step 407, a sample window is generated for a driver component selected at step 404, such as component sample window 201.

At step 408, a load window is generated. Such a load window is generated in response to area overlap of a connection window generated at step 405 and a sample area window for a load component window generated at step 406. Examples of load windows are load windows 205 and 215.

At step 409, a driver window is generated. Such a driver window is generated in response to area overlap of a connection window generated at step 405 and a sample window for a driver component generated at step 407. Examples of driver windows are driver windows 204 and 214.

At step 410, an optimal driver location is determined. Step 410 may be implemented with a function call made to a driver location optimization subroutine.

It should be understood that the term "optimal" and derivatives thereof as used herein is limited to the context of a connection having respective resource windows, such as driver and load windows, and optimization goals. It is not meant to include an optimal location as among all possible solutions of relocation of a resource anywhere on an integrated circuit. Furthermore, it should be appreciated that the depending on the type of optimization, such as "Greedy," "Hill Climbing" and "Simulated Annealing," among other well-known types of optimizations, an optimal location is viewed in terms of goals ascribed by one or more optimizations employed.

At step 411, an optimal load location is determined. Step 411 may be implemented with a function call made to a load location optimization subroutine.

Figure 5A:
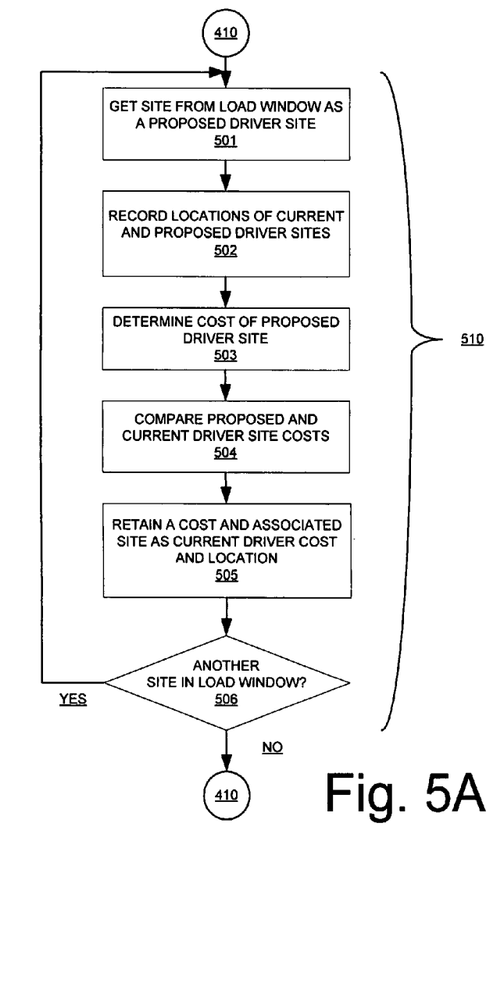
FIG. 5A is a process flow diagrams of an exemplary embodiment of driver location subroutine in accordance with one or more aspects of the present invention.
Figure 5B:
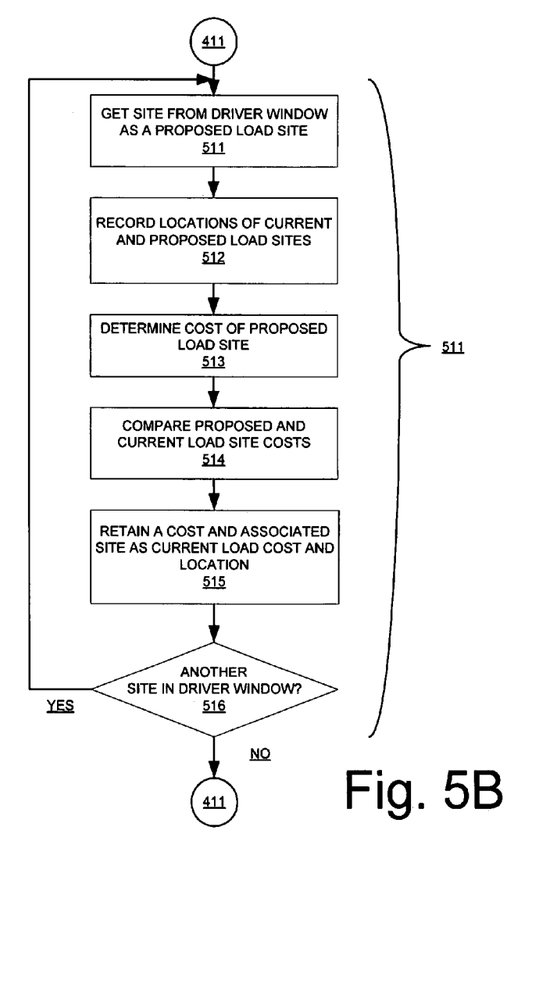
FIG. 5B is a process flow diagrams of an exemplary embodiment of load location subroutines in accordance with one or more aspects of the present invention.

Determination of optimal driver location and determination of an optimal load location as in steps 410 and 411 is described in more detail with respect to FIGS. 5A and 5B.

At step 412, either an optimal location for a driver or an optimal location for a load, as determined in steps 410 and 411, respectively, is selected. In other words, only one of these two possible locations is selected for step 413, where such a component is relocated. Thus, in step 413, either a driver component or a load component is relocated to either a load window or a driver window, respectively. Notably, it may be established that there was no available optimization for a particular critical connection, and thus, at step 413 the relocate component operation would be nullity. In other words, there would be no relocation at step 413.

Optionally, at step 414 a check is made regarding whether to examine another critical connection. It is not necessary that all critical connections be optimized prior to re-estimating delay. This is, in part, because by updating timing information for one or more critical connections, the total number of critical connections may be reduced, and thus runtime may be reduced in response to having fewer critical connections to address. However, if another critical connection is to be optimized, then another critical connection is obtained from the ranking at step 403. A next critical connection obtained from the ranking may be a next most critical connection, again in order to at least attempt to obtain the most improvement for optimization runtime.

If another critical connection is not to be optimized as determined at step 414, then optionally at step 415 a check is made regarding re-estimating connection delays. Once a critical connection has been relocated for improvement, such relocation usually impacts other connections. However, at step 415, it may be found that a critical connection cannot be optimized and thus re-estimating may not prove effective. Accordingly, optimization process 400 may end at step 417.

However, usually after optimization, it will be desirable to re-estimate delays for connections. Thus, optimization process 400 will usually proceed to step 399 for re-estimating after optional step 415. Such re-estimating done post optimization of at least one critical connection should produce a different set of critical connections, or at least a different set of negative slacks with respect to such critical connections. Accordingly, if there are any remaining critical connections at step 416 after re-estimating at step 399, then a new set of critical connections is collected at step 401. In this iterative manner, an integrated circuit may be optimized for both placement of resources or components responsive to their associated connectivity.

Referring to FIGS. 5A and 5B, there are shown process flow diagrams of exemplary embodiments of driver and load location optimization subroutines 510 and 511, respectively, in accordance with one or more aspects of the present invention. With continued reference to FIGS. 5A and 5B and renewed reference to FIGS. 2A, 2B and 4, though subroutines may more directly form a portion of optimization process 400, for purposes for clarity, optimization process 400 is described as calling up subroutines 510 and 511 at steps 410 and 411, respectively.

Driver location optimization subroutine 510, at step 501, obtains a site from a load window as a proposed driver site. In other words, driver subroutine 510 will attempt to find a location for a source component in a load window, such as load window 205 or 215.

At step 502, locations of a current driver and a proposed driver location or site are recorded. For example, driver component 102 may be relocated to location 212 of load window 215. Notably, if location 215 was available, then a tentative placement could be made without resource swapping. However, if location 212 were already occupied, then the current occupant would temporarily swap or switch locations with driver component 102.

At step 503, cost of the proposed driver site is determined. Notably, this cost may take into account slack times of two separate connections, such as connections 311 and 312 of FIG. 3, depending on location of a driver resource with respect to a path of which it is an element.

Evaluation of relocation cost may be done in terms slack time change. At step 504, a current driver site cost or slack time is compared with a slack time for a proposed location of such a driver. At step 505, the more favored cost may be retained along with an associated site or location for such a driver. The retained cost and associated location are retained as a current driver cost and location. By maintaining a most favored cost as associated with a location with a driver as a current placement, a subsequent iteration may be compared against that retained cost. Of course, location is retained in order to know how to obtain a lesser cost.

At step 506, there is a check as to whether another site in a load window is to be evaluated. In other words, there is a check to determine if all sites in a load window have been evaluated. If another site in a load window is to be checked, another site is obtained from such a load window at step 501 as a proposed driver site. If no other site in a load window is to be checked subroutine 510 returns to optimization process 400.

Load location optimization subroutine 511 is similar to driver location optimization subroutine 510. However, rather than attempting to place a source component in a load window, an attempt is made to place a load component in a driver window, such as placing load component 103 in a driver window 204 or 214. At step 511 a site from a driver window is obtained as a proposed load site. At step 512, an record of locations of a current and a proposed load site is made. Again, a proposed load site may or may not involve swapping resources depending on site availability. At step 513, a cost for a proposed load site is determined. Again, this cost may be stated in terms of slack time. At step 514 a comparison is made between a proposed load site cost and a current load site cost. As it should be understood, a current load site cost, as well as a current driver site cost in step 504, for a first iteration of subroutine 510 or 511 may be base on a delay established by an initial estimating of connections delays at step 399, in contrast to re-estimating for connection delays at step 399.

At step 515, a more favored cost and associated site are retained as a current load cost and location. For example, location 222 of driver window 214 may result in a better slack time than a current location of load component 103. Thus, continuing the example, location 222, as well as associated slack time of relocated load component 103 to location 222, is retained.

At step 516, a check for another site in a driver window, such as driver window 215, is made. If there is another site to be checked in a driver window, then another site is obtained from that driver window as a proposed load site at step 511. If there is no other site to be checked in a driver window at step 516, then subroutine 511 returns to optimization process 400.

With respect to subroutines 510 and 511, it is stated above that a more favored cost is retained. However, it should be understood that more "favored" does not necessarily mean best. Again, what is retained will depend in part on the optimization being used. For example, by using a Hill Climbing optimization paradigm a higher cost may be retained even if it temporarily produces a larger or more negative slack time. This is because if we always used a Greedy optimization paradigm, namely, one that only accepts the best slack time between alternatives, it is possible to select local minima. Allowing up hill moves in a controlled manner is a way to avoid selecting a local minimum over a better non-local minimum.

One way to do this is to define an iteration of optimization process 400 as n function calls, for n a number greater than one, of subroutines 510 and 511. In each operation, a best available move for a current situation is done even if it were to go "uphill," such as a larger negative slack time. After an iteration of n operations, a best result found for an operation would be investigated to determine whether it was better than a result of a previous iteration. If it was better than a result of a previous iteration it would be accepted and if was worse than a previous result of a prior iteration it would be rejected. So even though a resulting algorithm would be using a Greedy optimization on an iteration level it would allow uphill moves in an operation level in order avoid being trapped in a local minima.

As mentioned with respect to step 402, critical connections may be ranked by negative slack time. Though using slack time as a primary criterion for sorting, it is possible to use other criteria for sorting critical connections. For example, critical connections may be sorted based on a secondary criterion of logic level. For example, critical connections may be sorted by the number of logic levels between connections and source of a timing path. By using such a secondary criterion, consistency in terms of directionality object moves is introduced to avoid situations where different sections of a path may move away from each other while optimizing a connection or portion of such a path ("subpath").

Figure 6:
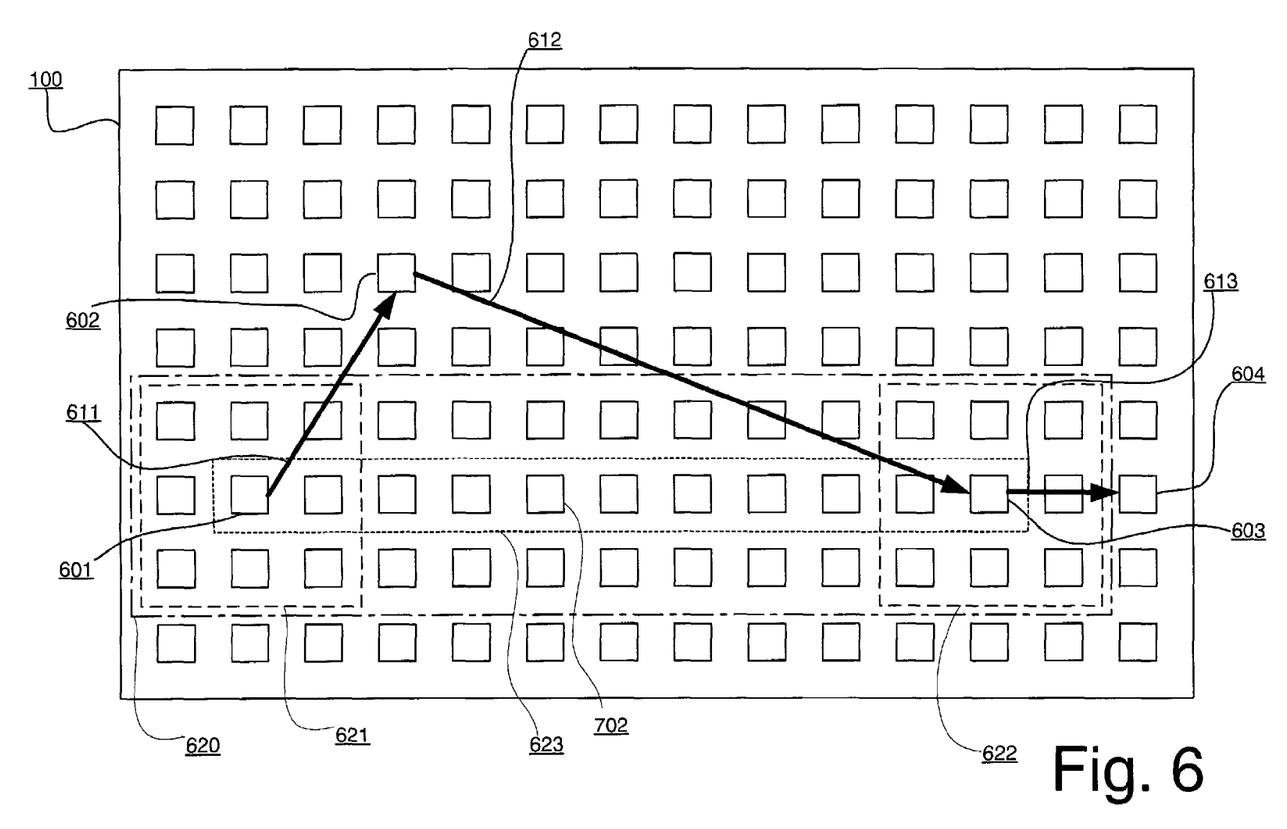
FIG. 6 is a top view block diagram of the integrated circuit of FIG. 1 having another path and having other exemplary embodiments of component sample windows in accordance with one or more aspects of the present invention.

Furthermore, a list of potential sites may be extended beyond load window and driver window to include sites close to a connection of a critical path, as shown with respect to FIG. 6.

FIG. 6 is a top view block diagram of the integrated circuit of FIG. 1 having a path connection window in accordance with one or more aspects of the present invention. Resources 601, 602, 603 and 604 form a path or subpath, along with connections with respective connections 611, 612 and 613. Rather than using a connection window as between a resource 602 and a resource 603, as previously described, a connection window 620 and a path window 623 from resource 601 to resource 603 are generated bypassing resource 602.

Component sample windows 621 and 622 are generated about resources 601 and 603, respectively. Windows 621 and 622 may be epsilon windows, such as one or more components, though an epsilon of one is shown in FIG. 6. An intersection region or area as between sample component windows 621 and 622 and connection windows 620 defines respective load and driver windows. As in the example of FIG. 6, load and driver windows are equivalent to component sample windows 622 and 621, respectively, for clarity windows 621 and 622 are hereinafter referred to as driver window 621 and load window 622.

Path window 623 is generated by generating a straight line from driver resource 601 to load resource 603, bypassing resource 602, where such a line has a delta component width. Such a delta width is at least a portion of a component width. Though a horizontal path window 623 is shown in FIG. 6, a diagonal or vertical path window may be formed. For a diagonal path window, some components may fall on a boundary. Accordingly, boundary conditions may be used. For example, a threshold percentage of a component must be met for such a component to be considered within a path window.

Sites within window 623, load window 622 and driver window 621 are used to determine whether an intermediate resource, namely resource 602, between resources 601 and 603 may be relocated within such windows 621, 622 and 623. Notably, because there may be overlap between sampling sites in each of windows 621 and 623, or 622 and 623, sites may be processed twice. To avoid such unnecessary duplication, a filter may be used such that each site is only processed once. Furthermore, other restrictions may be used for sampling sites. For example, sites may be restricted to path window 623 and areas within driver and load windows 621 and 622, respectively, that intersect path window 623.

Figure 7:
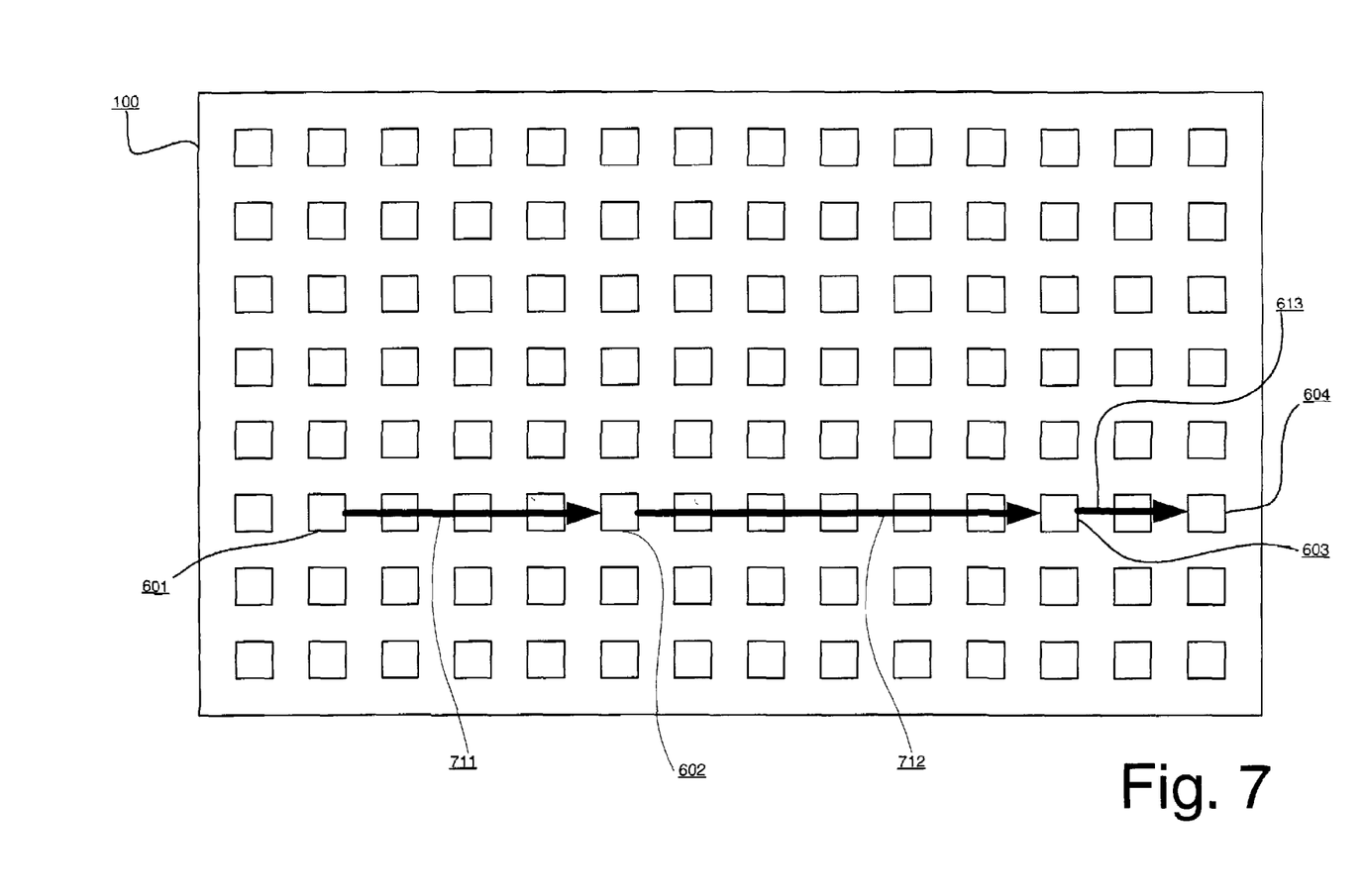
FIG. 7 is a top view block diagram of the integrated circuit of FIG. 1 after component relocation for improvement of the path of FIG. 6 in accordance with one or more aspects of the present invention.

With respect to relocation of resource 602, if a location 702 provides a better solution than present location of resource 602, then a more optimal result may be attained with respect to path delay as illustratively shown in FIG. 7. FIG. 7 is a top view block diagram of the integrated circuit of FIG. 1 after component relocation for improvement of the path of FIG. 6 in accordance with one or more aspects of the present invention. In FIG. 7, connections 611 and 612 of FIG. 6 have been replaced with connections 711 and 712, respectively, as resource 602 has been moved to location 702 for a better result.

Figure 8:
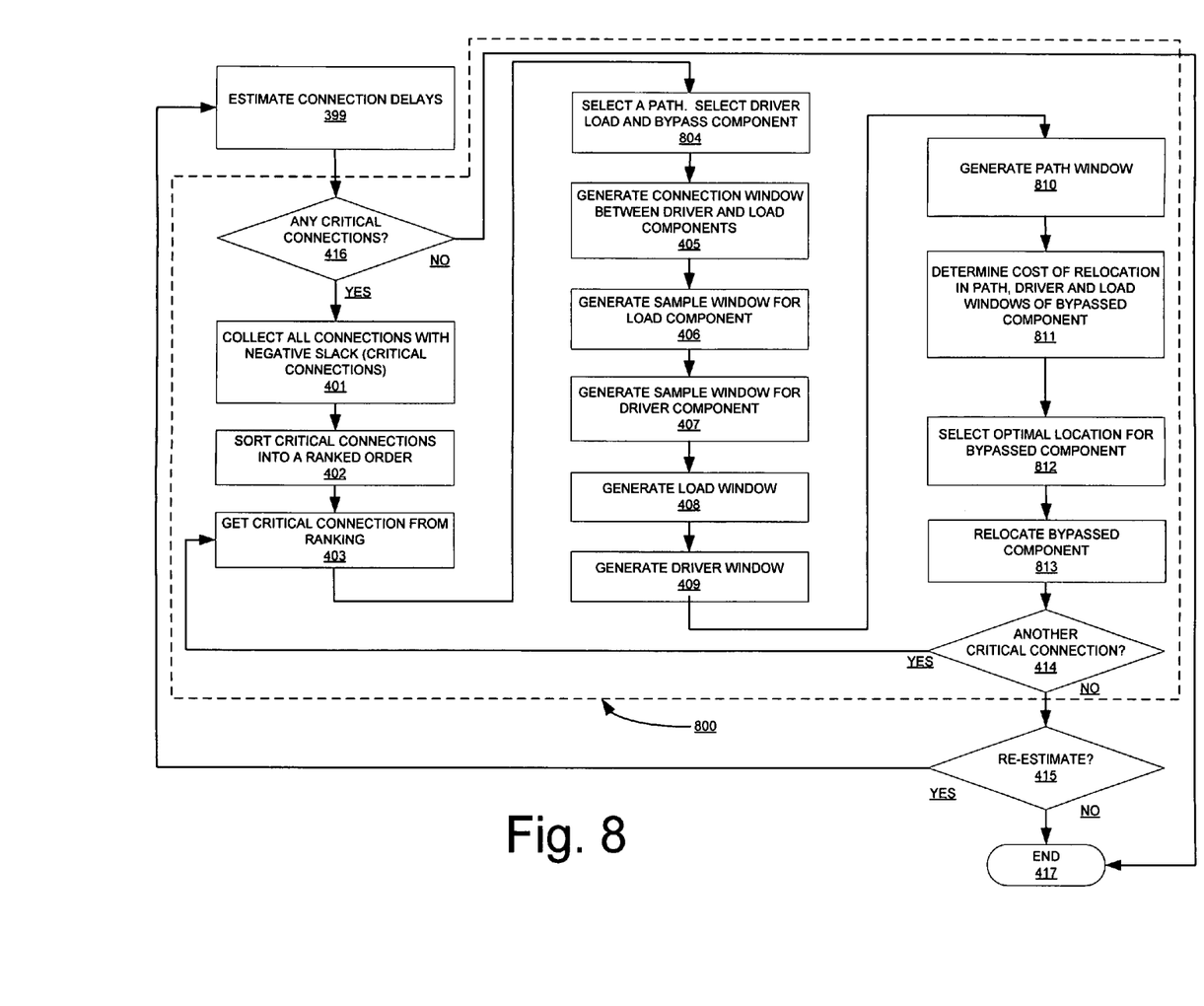
FIG. 8 is a process flow diagram of another exemplary embodiment of an optimization process in accordance with one or more aspects of the present invention.

FIG. 8 is a process flow diagram of an exemplary embodiment of an optimization process 800 in accordance with one or more aspects of the present invention. With continuing reference to FIG. 8 and renewed reference to FIG. 6, optimization process 800 comprises many of the same steps of optimization process 400 of FIG. 4 except that a resource is "bypassed." Accordingly, much of the description of those previously described steps is not repeated here for purposes of clarity.

At step 804, a component to be bypassed for optimizing is selected. Notably, the resource ultimately is used in the path, and thus is not bypassed in this sense. However, the component is bypassed for determining areas of possible relocation sites. This selection in the context of an intermediate resource of a path or subpath effectively selects driver and load components connected to such a component to be bypassed. This bypassed resource is connected to at least one critical connection. Steps 405 through 409 are repeated, as previously described, but for using driver and load resources of a bypassed component. At step 811, a path window, such as path window 623, is generated in response to driver and load resources selected at step 804.

At step 811, cost of relocating a bypassed resource, such as component 602, to sites in path, driver and load windows, such as windows 623, 621 and 622, is determined. Notably, as described above, one or more optimization criteria may be used for selecting a site from possible sites associated with search windows. Notably, unlike steps 410 and 411 where there is an attempt to move a component of one type to a window of another type, a new location for a bypassed resource is checked in search windows of both types, as well as a path window. Notably, in a first alternative, from at least one to less than all search windows may be checked to reduce runtime. In a second alternative, only a portion of sites may be checked to reduce runtime. Moreover, a combination of the first and the second alternative may be used, as well as a combination of any of the above.

At step 812, an optimal location of site evaluated in driver, load and path windows is selected. Such selection is made based on costs determined at step 811. At step 813, a bypassed component is relocated to a site within one of load, drive or subpath windows provided, however, such site provides an improvement over a current location of such a bypassed component.

Figure 9:
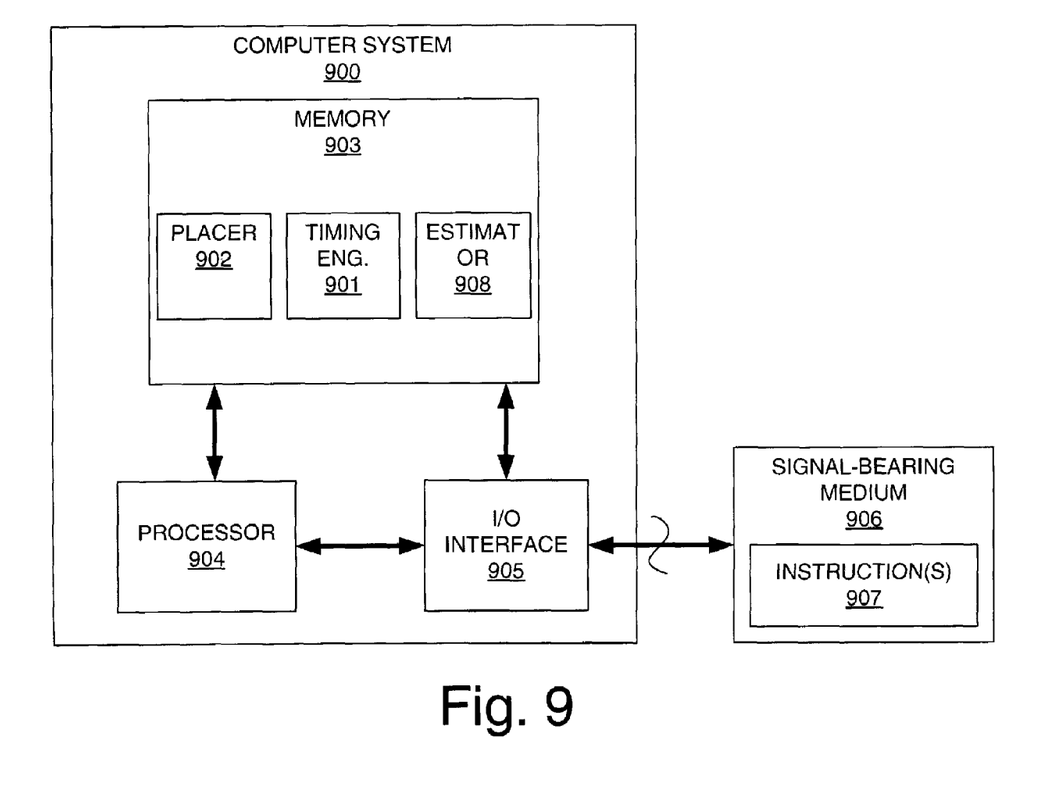
FIG. 9 is a block diagram of an exemplary embodiment of a computer system that may be put in communication with a signal-bearing medium in accordance with one or more aspects of the present invention.

FIG. 9 is a block diagram of an exemplary embodiment of a computer system 900 that may be put in communication with a signal-bearing medium 906 in accordance with one or more aspects of the present invention. Computer system 900 comprises memory 903 which may be programmed with all or a portion of a timing engine 901, estimator 908 and placer 902. Estimator 908 may include or have access to timing engine 901 to obtain delay timing information for possible connectivity. Placer 902 is used to place components, as described above. Memory 903 is coupled to processor 904, and optionally is coupled to input/output (I/O) interface 905 for direct memory addressing. Processor 904 is coupled to I/O interface 905.

Signal-bearing medium 906 may comprise instructions 907 in the form of one or more programs or routines, including, but not limited to, subroutines, which, when executed by computer system 900, cause execution of all or a portion of an optimization process in accordance with one or more aspects of the present invention. Instructions 907 may comprise all or a portion of instructions for routines 400, 800, as well as all or a portion of instructions for subroutines 510, 511.

One or more aspects of the invention are implemented as one or more program products for use with a computer system such as, for example, computer system 900. The program(s) of the program product defines functions of the one or more aspects and can be contained on a variety of signal/bearing media, which include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct the functions of the invention, represent one or more aspects of the invention.

While the foregoing is directed to the preferred embodiment of the present invention, other and further embodiments of the invention may be devised without departing from the basic scope thereof, and the scope thereof is determined by the claims that follow. For example, though windows were shown for picking possible relocation sites, such possible relocation sites may be selected without windows by indexing off of driver and load sites with at least a one-component epsilon.

All trademarks are the property of their respective owners.

The invention claimed is:

1. A method for simulating relocation of a component of an integrated circuit having a plurality of components to be coupled to one another via interconnects where the interconnects have associated delays, comprising:
   identifying at least one connection, the at least one connection having a driver component and a load component;
   generating a first component sample window in response to the driver component;
   generating a second component sample window in response to the load component;
   generating a connection window in response to the at least one connection;
   generating a driver window in response to overlap between the connection window and the first component sample window;
   generating a load window in response to overlap between the connection window and the second component sample window;
   determining a site for relocating the driver component or the load component; and
   relocating the driver component or the load component to the site.

2. The method according to claim 1, wherein the step of determining comprises:
   determining a driver location for the driver component in the load window;
   determining a load location for the load component in the driver window; and
   selecting one of the driver location and the load location for the site.

3. The method according to claim 2, wherein the step of selecting comprises using at least one optimization criterion.

4. The method according to claim 3, wherein the at least one optimization criterion is selected from Greedy optimization, Hill Climbing and Simulated Annealing.

5. The method according to claim 2, wherein the step of determining the driver location comprises:
   obtaining a proposed driver location in the load window;
   determining cost of the proposed driver location;
   comparing cost of the proposed driver location with a cost for the current driver location;
   retaining one of the cost of the proposed driver location and the cost of the current driver location; and
   retaining one of the proposed driver location and the current driver location responsive to the cost retained.

6. The method according to claim 5, further comprising selecting another proposed driver location.

7. The method according to claim 2, wherein the step of determining the load location comprises:
   obtaining a proposed load location in the driver window;
   determining cost of the proposed load location;
   comparing cost of the proposed load location with a cost for the current load location;
   retaining one of the cost of the proposed load location and the cost of the current load location; and
   retaining one of the proposed load location and the current load location responsive to the cost retained.

8. The method according to claim 7, further comprising selecting another proposed load location.

9. A method for simulating relocation of a component of an integrated circuit having a plurality of components to be coupled to one another via interconnects where the interconnects have associated delays, comprising:
   identifying a path between components;
   selecting a driver component, a load component and a bypass component;
   generating a first component sample window in response to the driver component;
   generating a second component sample window in response to the load component;
   generating a connection window in response to the at least one connection;
   generating a path window responsive to the driver component and the load component;
   generating a driver window in response to overlap between the connection window and the first component sample window;
   generating a load window in response to overlap between the connection window and the second component sample window;
   determining a site for relocating the bypass component; and
   relocating the bypass component to the site.

10. The method according to claim 9, the path window is generated in response to a straight line from the driver component to the load component, the straight line having at least a portion of a component width.

11. The method according to claim 10, wherein the step of determining comprises:
    checking sites in the driver window, the load window and the path window for relocating the bypass component; and
    selecting a site.

12. The method according to claim 11, wherein the step of selecting comprises using at least one optimization criterion.

13. The method according to claim 12, wherein the at least one optimization criterion is selected from Greedy optimization, Hill Climbing and Simulated Annealing.

14. A post-placement optimization process for location of components of an integrated circuit, comprising:
    providing a simulation of an integrated circuit, the simulation of the integrated circuit having simulated connections, the simulated connections having associated delays;
    collecting critical connections from the simulated connections, the critical connections having associated negative slack times;
    ranking the critical connections responsive to the negative slack times;
    selecting a critical connection from the ranking, the connection having a driver component and a load component associated therewith;
    generating component windows for the critical connection selected;
    generating a connection window for the critical connection selected;
    determining overlaps between the connection window and each of the component windows to provide a first and a second search windows;
    selecting a proposed driver location in the first search window for the driver component;

selecting a proposed load location in the second search window for the load component;
determining cost of the proposed driver location;
comparing cost of the proposed driver location with a cost for the current driver location;
retaining one of the cost of the proposed driver location and the cost of the current driver location;
retaining one of the proposed driver location and the current driver location responsive to the cost retained;
determining cost of the proposed load location;
comparing cost of the proposed load location with a cost for the current load location;
retaining one of the cost of the proposed load location and the cost of the current load location; and
retaining one of the proposed load location and the current load location responsive to the cost retained.

15. The process according to claim 14, further comprising:
relocating one of the driver component and the load component to its retained location; and
re-estimating delays for the integrated circuit responsive to relocation of the one of the driver component and the load component.

16. The process according to claim 15, wherein the driver component is relocated to the location associated with the first search window.

17. The process of claim 15, wherein the load component is relocated to the location associated with the second search window.

18. The process according to claim 15, further comprising:
obtaining another critical connection for repeating the process.

19. A computer readable recording medium having instructions, which when executed by a computer system having access to a simulated integrated circuit with resources and connections, cause a method for location of components of an integrated circuit to be performed, the method comprising:
identifying at least one connection from the connections, the at least one connection having a driver component and a load component;
generating a first component sample window in response to the driver component;
generating a second component sample window in response to the load component;
generating a connection window in response to the at least one connection;
generating a driver window in response to overlap between the connection window and the first component sample window;
generating a load window in response to overlap between the connection window and the second component sample window;
determining a site for relocating the driver component or the load component; and
relocating the driver component or the load component to the site.

20. A computer readable recording medium having instructions, which when executed by a computer system having access to a simulated integrated circuit with resources and connections, cause a method for location of components of an integrated circuit to be performed, the method comprising:
identifying a path between components;
selecting a driver component, a load component and a bypass component;
generating a first component sample window in response to the driver component;
generating a second component sample window in response to the load component;
generating a connection window in response to the at least one connection;
generating a path window responsive to the driver component and the load component;
generating a driver window in response to overlap between the connection window and the first component sample window;
generating a load window in response to overlap between the connection window and the second component sample window;
determining a site for relocating the bypass component; and
relocating the bypass component to the site.

21. A computer readable recording medium having instructions, which when executed by a computer system having access to a simulated integrated circuit with connections having delays for connecting resources, cause a method for location of components of an integrated circuit to be performed, the method comprising:
collecting critical connections from the simulated connections, the critical connections having associated negative slack times;
ranking the critical connections responsive to the negative slack times;
selecting a critical connection from the ranking, the connection having a driver component and a load component associated therewith;
generating component windows for the critical connection selected;
generating a connection window for the critical connection selected;
determining overlaps between the connection window and each of the component windows to provide a first and a second search windows;
selecting a proposed driver location in the first search window for the driver component;
selecting a proposed load location in the second search window for the load component;
determining cost of the proposed driver location;
comparing cost of the proposed driver location with a cost for the current driver location;
retaining one of the cost of the proposed driver location and the cost of the current driver location;
retaining one of the proposed driver location and the current driver location responsive to the cost retained;
determining cost of the proposed load location;
comparing cost of the proposed load location with a cost for the current load location;
retaining one of the cost of the proposed load location and the cost of the current load location; and
retaining one of the proposed load location and the current load location responsive to the cost retained.

22. A method for simulating relocation a component of an integrated circuit having a plurality of components to be coupled to one another via interconnects where the interconnects have associated delays, comprising:
identifying at least one connection, the at least one connection having a driver component and a load component;
generating a first component sample area in response to the driver component;
generating a second component sample area in response to the load component;

generating a connection area in response to the at least one connection;

generating a driver area in response to overlap between the connection area and the first component sample area;

generating a load area in response to overlap between the connection area and the second component sample area;

determining a site for relocating the driver component or the load component; and relocating the driver component or the load component to the site.

23. The method according to claim 22, wherein the at least one of the first component sample area, the second component sample area and the connection area are generated with at least a one component epsilon.

24. A post-placement optimization process for location of components of an integrated circuit, comprising:

providing a simulation of an integrated circuit, the simulation of the integrated circuit having simulated connections, the simulated connections having associated delays;

collecting critical connections from the simulated connections, the critical connections having associated negative slack times;

ranking the critical connections responsive to the negative slack times;

selecting a critical connection from the ranking, the connection having a driver component and a load component associated therewith;

generating component areas for the critical connection selected;

generating a connection area for the critical connection selected;

determining overlaps between the connection area and each of the component areas to provide a first and a second search areas;

selecting a proposed driver location in the first search area for the driver component;

selecting a proposed load location in the second search area for the load component; and determining cost of the proposed driver location;

comparing cost of the proposed driver location with a cost for the current driver location;

retaining one of the cost of the proposed driver location and the cost of the current driver location;

retaining one of the proposed driver location and the current driver location responsive to the cost retained;

determining cost of the proposed load location;

comparing cost of the proposed load location with a cost for the current load location;

retaining one of the cost of the proposed load location and the cost of the current load location; and retaining one of the proposed load location and the current load location responsive to the cost retained.

* * * * *